United States Patent
Asuri et al.

(10) Patent No.: US 8,781,411 B2
(45) Date of Patent: Jul. 15, 2014

(54) BASEBAND FILTER AND UPCONVERTER WITH CONFIGURABLE EFFICIENCY FOR WIRELESS TRANSMITTERS

(75) Inventors: Bhushan Shanti Asuri, San Diego, CA (US); Ibrahim Ramez Chamas, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 387 days.

(21) Appl. No.: 13/353,050

(22) Filed: Jan. 18, 2012

(65) Prior Publication Data

US 2013/0183914 A1 Jul. 18, 2013

(51) Int. Cl.
*H04B 1/02* (2006.01)

(52) U.S. Cl.
USPC ....... 455/91; 455/127.5; 455/115.1; 455/311; 370/252

(58) Field of Classification Search
CPC ... H03F 1/0277; H03F 1/0222; H03F 1/0233; H03F 3/189; H04B 3/02; H04B 1/0483; H04B 2001/0408; H04B 2001/0433; H04B 2001/045; H04L 25/0272; H04L 27/2614; H04L 27/2626; H04W 52/367; H03D 2200/0025; H03G 3/3042
USPC ............ 455/127.1–127.3, 127.5, 91, 93, 126, 455/253.2, 293, 311, 144, 115.1, 303, 118, 455/102; 370/252
See application file for complete search history.

(56) References Cited

U.S. PATENT DOCUMENTS

| | | | |
|---|---|---|---|
| 6,185,263 B1 | 2/2001 | Chan | |
| 6,615,028 B1 * | 9/2003 | Loke et al. | 455/127.1 |
| 7,248,120 B2 | 7/2007 | Burgener et al. | |
| 7,456,773 B1 | 11/2008 | Seo et al. | |
| 7,508,236 B2 | 3/2009 | Lai et al. | |
| 7,796,958 B2 * | 9/2010 | Seo et al. | 455/91 |
| 8,095,092 B2 * | 1/2012 | Muller et al. | 455/127.1 |
| 8,417,198 B1 * | 4/2013 | Lipshitz et al. | 455/127.1 |
| 8,520,550 B2 * | 8/2013 | Al-Dhahir et al. | 370/252 |
| 2004/0127173 A1 * | 7/2004 | Leizerovich | 455/93 |
| 2005/0136854 A1 | 6/2005 | Akizuki et al. | |
| 2005/0253711 A1 * | 11/2005 | Nelson | 340/552 |
| 2007/0014382 A1 | 1/2007 | Shakeshaft et al. | |
| 2010/0069025 A1 * | 3/2010 | Takinami et al. | 455/127.3 |
| 2010/0074131 A1 * | 3/2010 | Onggosanusi et al. | 370/252 |
| 2011/0026638 A1 | 2/2011 | Mu | |
| 2012/0214422 A1 * | 8/2012 | Shi et al. | 455/67.11 |

FOREIGN PATENT DOCUMENTS

WO 0199270 A2 12/2001

OTHER PUBLICATIONS

International Search Report and Written Opinion—PCT/US2013/022216—ISA/EPO—Jul. 5, 2013.
Seo, D., et al., "A Pseudo differential Class AB DAC for Low—Power Wireless Transmitter", IEEE Transactions on Circuits and Systems I: Regular Papers, IEEE, US, vol. 56, No. 10, Oct. 1, 2009, pp. 2332-2340, XP011333540.
Palumbo, et al., "A Class AB CMOS Current Mirror with Low-Voltage Capability," Proceedings of ICECS '99 The 6th IEEE International Conference on Electronics, Circuits and Systems, 1999, vol. 2, pp. 891-894.

* cited by examiner

*Primary Examiner* — Sujatha Sharma
(74) *Attorney, Agent, or Firm* — Ramin Mobarhan

(57) ABSTRACT

A baseband filter and upconverter with configurable efficiency for use in wireless transmitters is disclosed. In an exemplary embodiment, an apparatus is provided that includes a baseband filter having configurable efficiency, and an upconverter having configurable efficiency and coupled to the baseband filter. The baseband filter and upconverter are configured to operate at a first efficiency level in a first output power range and to operate at a second efficiency level in a second output power range.

20 Claims, 5 Drawing Sheets

BASEBAND FILTER AND UPCONVERTER WITH CONFIGURABLE EFFICIENCY FOR WIRELESS TRANSMITTERS

BACKGROUND

1. Field

The present application relates generally to the operation and design of wireless devices, and more particularly, to the design and operation of configurable transmitters for wireless devices.

2. Background

There is an increasing demand to have wireless devices capable of high quality transmission and reception while consuming low power. One key to achieving high quality is associated with the performance of the device's transmitter. For example, it is desirable to have a transmitter that operates efficiently over its entire output power range.

In existing transmitter designs, a baseband (BB) filter and upconverter are used to filter a baseband signal and up-convert the filtered signal to radio frequencies (RF) for transmission. Typically, both the baseband filter and upconverter are configured for Class-A operation across the entire output power range to meet stringent linearity requirements at maximum power. Unfortunately, at lower output powers, such as during typical talk-times in a wireless device, Class-A operation is very inefficient thereby reducing battery life. It is therefore desirable to have a more efficient transmitter for use in wireless devices.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
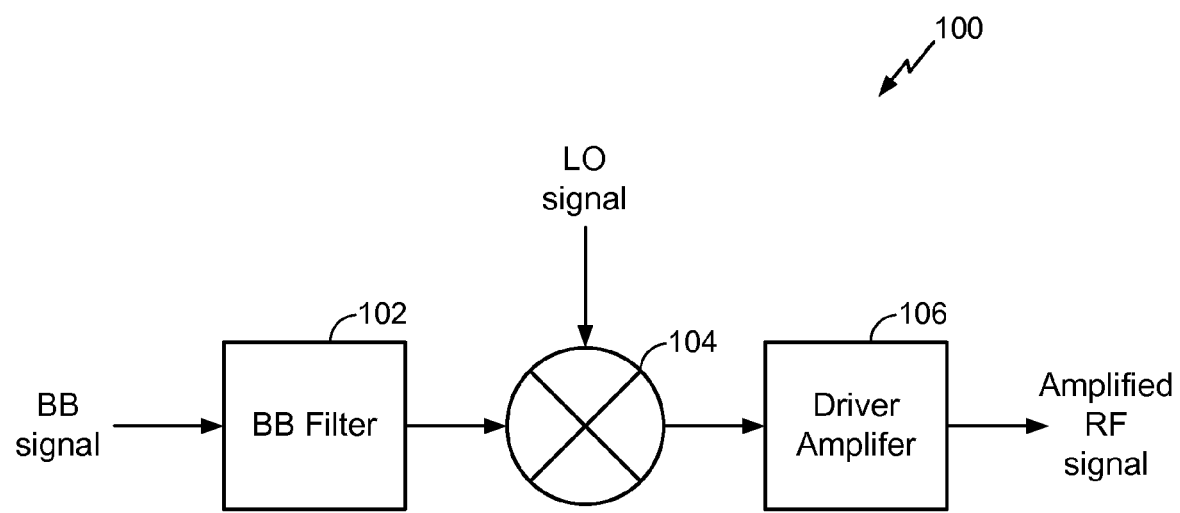
FIG. 1 shows a block diagram of a conventional wireless transmitter comprising a baseband filter and upconverter.

FIG. 1 shows a block diagram of a conventional wireless transmitter 100 comprising a baseband filter 102 and upconverter 104. The baseband filter 102 receives a baseband signal and outputs a filtered baseband signal that is input to the upconverter 104. The upconverter 104 receives a local oscillator (LO) signal and uses this LO signal to upconvert the filtered baseband signal to a radio frequency (RF) signal that is input to a driver amplifier 106. The driver amplifier 106 operates to amply the RF signal it receives to produce an amplified RF signal at its output.

In this conventional transmitter 100, the baseband filter 102 and upconverter 104 are configured for Class-A operation throughout the entire transmit power range. For example, the baseband filter 102 and upconverter 104 are configured for Class-A operation to meet stringent linearity requirements at maximum power. Unfortunately, at lower output powers, such as during typical talk-times in a wireless device, Class-A operation is very inefficient thereby reducing battery life.

Figure 2:
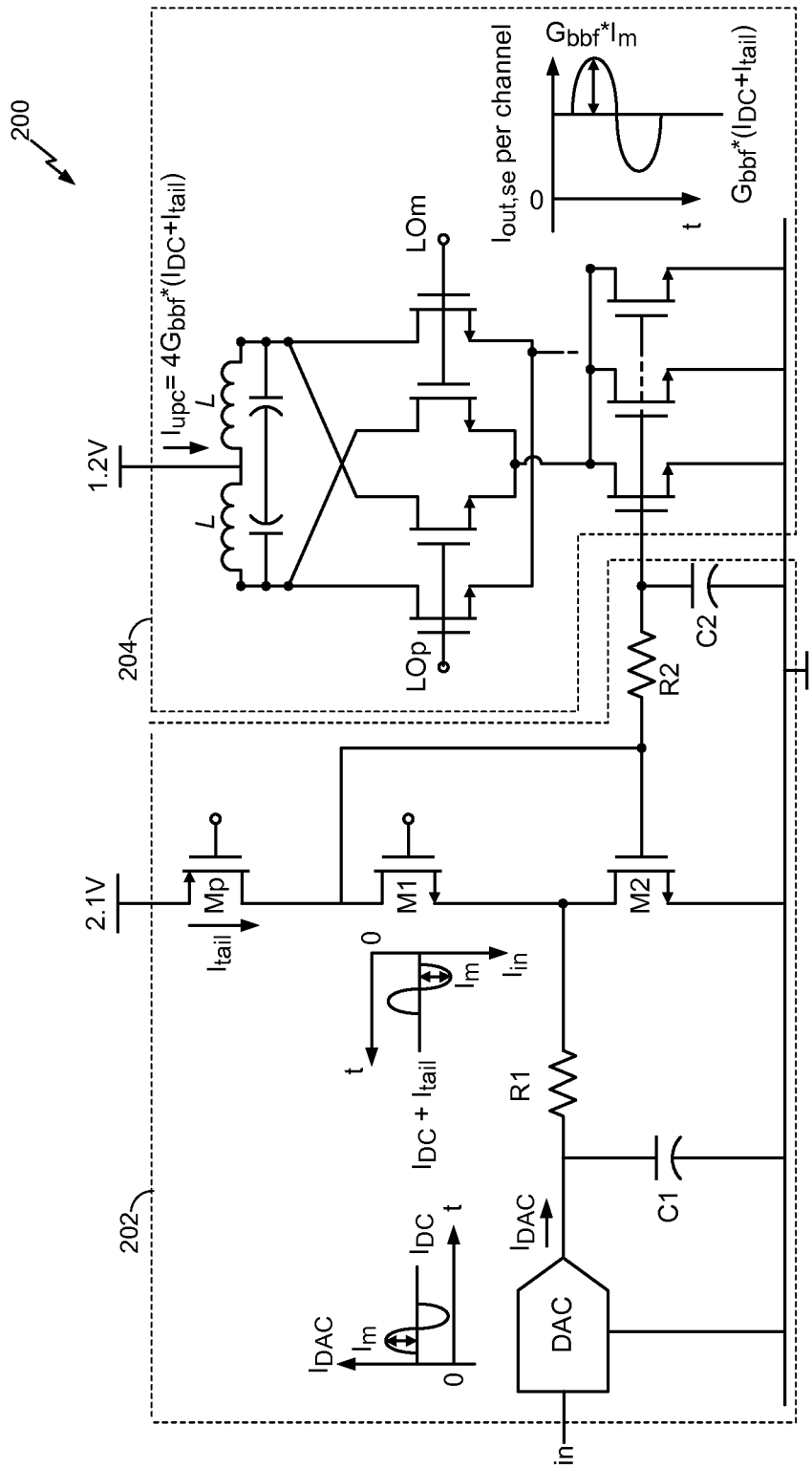
FIG. 2 shows a portion of a conventional wireless transmitter comprising a baseband filter and upconverter.

FIG. 2 shows a portion of a conventional wireless transmitter 200 comprising a baseband filter 202 and upconverter 204. In this conventional transmitter 200, the baseband filter 202 and upconverter 204 are configured for Class-A operation throughout the entire transmit power range.

During operation, a digital-to-analog converter (DAC) generates a modulated base-band signal in the current domain. The DAC current ($I_{DAC}$) comprises a direct current ($I_{DS}$) component and an alternating current (AC) component with amplitude $I_m$. The signal current and DC current are related by the following expression.

$$I_m = I_{DC}\text{(full-scale)} \qquad (1)$$

The BB filter 202 comprises a current-mirror (CM) with two poles having time constants of R1*C1 and R2*C2, respectively. An input loop of the BB filter 202 comprises transistors M1, M2. Transistor Mp adds a DC component ($I_{tail} = 0.15\ I_{DC}$) to the DAC current to improve linearity at high power levels. The input current, $I_{in}$, is mirrored and amplified by a BB filter gain factor ($G_{bbf}$). Since there are four channels, the upconverter's 204 DC current can be determined from the following expression.

$$I_{upc} = 4 * G_{bbf} * (I_{DC} + I_{tail}) \qquad (2)$$

Figure 3:
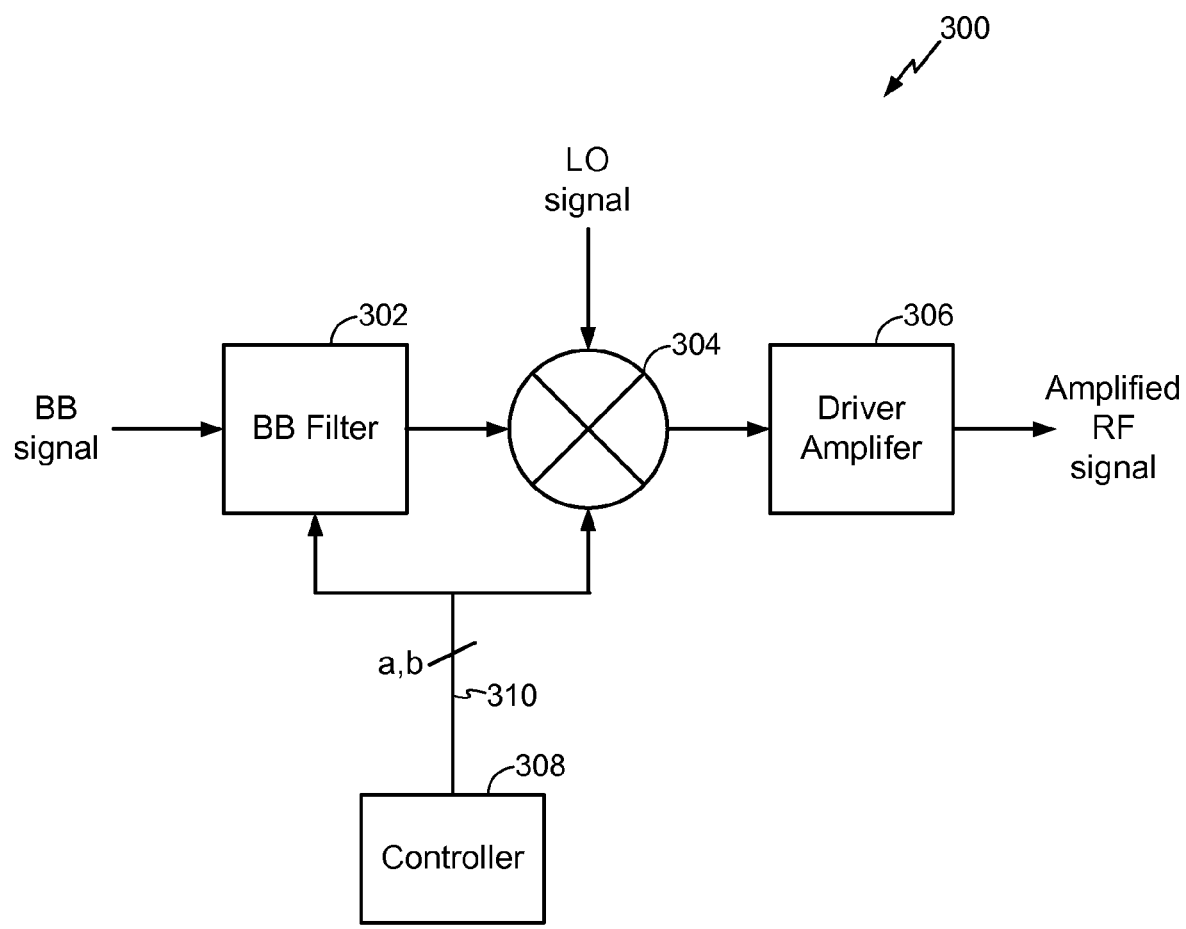
FIG. 3 shows a block diagram of a wireless transmitter comprising exemplary embodiments of a configurable baseband filter and upconverter.

FIG. 3 shows a block diagram of a wireless transmitter 300 comprising exemplary embodiments of a configurable baseband filter 302 and upconverter 304. For example, the baseband filter 302 and upconverter 304 can be operated with configurable efficiency. The configurable baseband filter 302 receives a baseband signal and outputs a filtered baseband signal that is input to the configurable upconverter 304. The upconverter 304 receives a local oscillator (LO) signal and uses this LO signal to upconvert the filtered baseband signal to a radio frequency (RF) signal that is input to a driver amplifier 306. The driver amplifier 306 operates to amply the RF signal it receives to produce an amplified RF signal at its output.

When operating at high transmit powers, the baseband filter 302 and upconverter 304 can be configured to operate in a Class-A operating mode (i.e., first efficiency level) to meet maximum power requirements. When operating during talk-time intervals or during other times when lower transmit powers are used, the baseband filter 302 and upconverter 304 can be configured to operate in a higher efficiency operating mode (i.e., second efficiency level) such as a Class-A/B, Class-B, or Class C mode, that provides more efficiency than the first efficiency level and therefore conserves battery power.

A controller 308 is provided that determines the output power requirements of the transmitter 300. For example, the controller 308 receives indications of the output power requirements of the transmitter 300 from another entity (not shown) in a wireless device. The controller 308 operates to output class selection signals (a,b) 320 that are coupled to the baseband filter 302 and upconverter 304. For the purpose of this description, the class selection signals (a,b) are used to configure the baseband filter 302 and upconverter 304 to operate at a first efficiency level (i.e., Class-A operating mode) or at higher second efficiency level, such as a Class-B operating mode or higher depending on the output power requirements. It should be noted that in various exemplary embodiments, the baseband filter 302 and upconverter 304 can be configured to operate in several higher efficiency operating mode, such as Class A/B, Class B, or Class C. Accordingly, during intervals when the baseband filter 302 and upconverter 304 are configured to operate in the higher efficiency operation mode; lower power is consumed thereby increasing the battery life of the wireless device.

Figure 4:
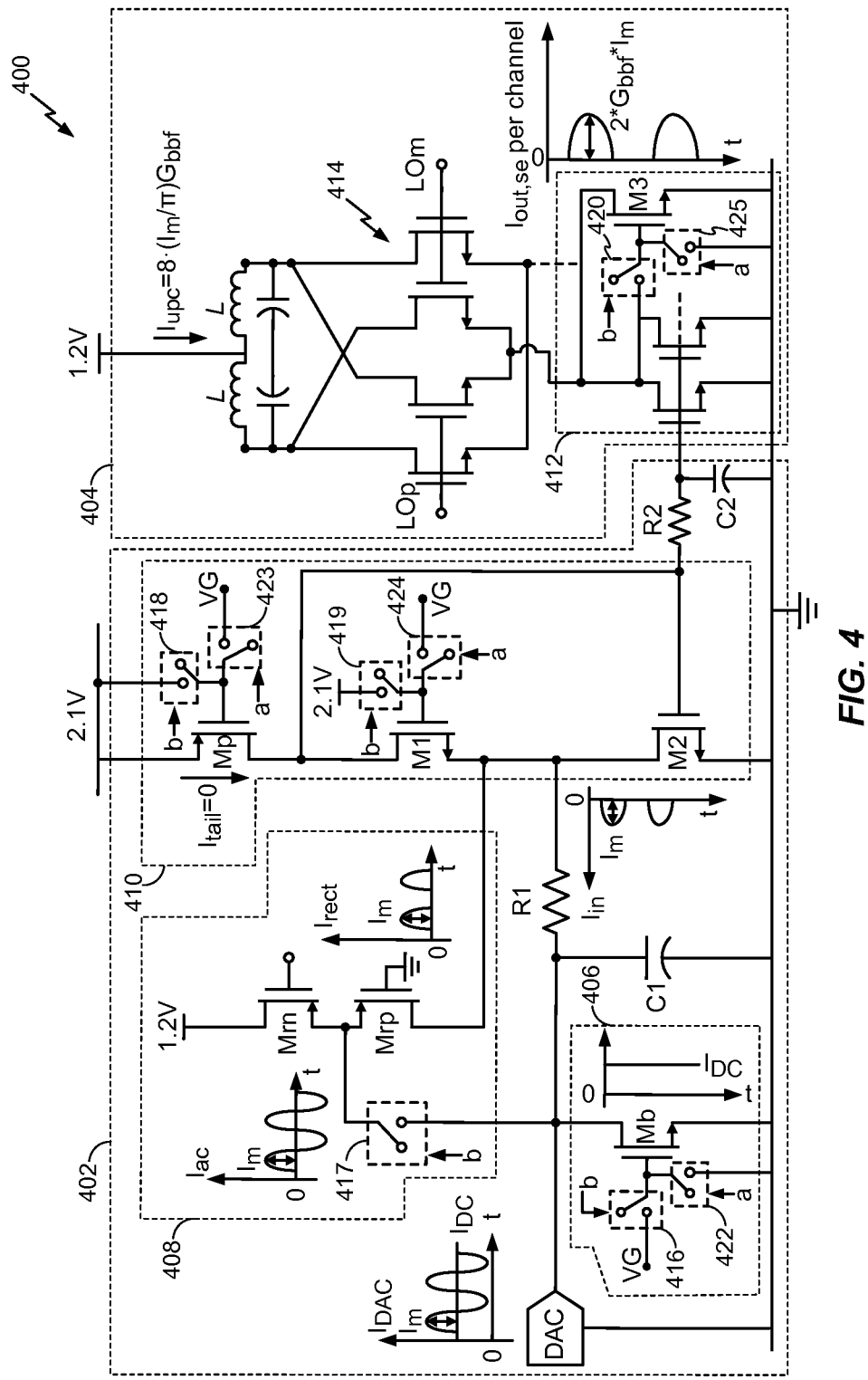
FIG. 4 shows a portion of a wireless transmitter comprising exemplary embodiments of a configurable baseband filter and upconverter.

FIG. 4 shows a portion of a wireless transmitter 400 comprising an exemplary embodiment of a configurable baseband filter 402 and upconverter 404. For example, the transmitter 400 is suitable for use in a wireless device. The baseband filter 402 and upconverter 404 have configurable efficiency and are configurable between operation in a Class-A operating mode (first efficiency level) and operation in a higher efficiency operating mode, such as Class A/B, Class B, or Class C (second efficiency level). The higher efficiency operating mode is used during low output power to conserve battery current during talk-time or during other low output power time intervals. The baseband filter 402 and upconverter 404 are configurable into the Class-A operating mode at the transmitter's top power range to meet maximum power requirements.

The operation of the transmitter 400 is described below where the higher efficiency operating mode is a Class B operating mode. However, in other embodiments, the higher efficiency operating mode can be another high efficiency operating mode, such as a Class A/B operating mode or a Class C operating mode.

As shown in FIG. 4, the BB filter 402 comprises: a DAC with a variable DC current bleed circuit 406 comprising transistor (Mb); a half-wave current rectifier circuit 408 comprising transistors (Mrn, Mrp); a single-pole RC filter (R1, C1); a configurable transimpedance input loop 410 comprising transistors (M1, M2, and Mp); and a second RC pole (R2, C2). The upconverter 404 comprises a configurable transconductance cell 412 comprising a set of transistors (designated as M3) that feed upconverter quad switching devices 414.

The BB filter 402 and upconverter 404 further comprise additional circuitry and switches that are used to configure the BB filter 402 and upconverter 404 between the Class-A operating mode and a higher efficiency operating mode. For example, the efficiency of the BB filter 402 and upconverter 404 are configured by switches 416-420 and switches 422-425. The switches operate to set bias conditions and circuit connections that configure the BB filter 402 and upconverter 404 to operate in either the Class-A operating mode or the higher efficiency operating mode, for example, a Class B operating mode.

The controller 308 (not shown in FIG. 4) operates to control the operation of the switches as described below. For example, to configure the baseband filter 402 and upconverter 404 to operate in the Class-A operating mode, the switches 422-425 are set to an "on" state (i.e., closed) and the switches 416-420 are set to an "off" state (i.e., open). To configure the baseband filter 402 and upconverter 404 to operate in the higher efficiency Class-B operating mode the switches 422-425 are set to the "off" state and the switches 416-420 are set to the "on" state. The controller 308 operates to output switch control signals a,b to control the switches (i.e., set either the off or on states) to enable either the Class-A operating mode or the higher efficiency Class-B operating mode.

In the higher efficiency Class-B operating mode, the current bleed circuit 406 operates to drain the DC current component ($I_{DC}$) of the DAC output to ground through transistor Mb. The remaining AC current with amplitude ($I_m$), travels to rectifying transistors Mrn and Mrp of the half-wave current rectifier circuit 408.

The half-wave current rectifier circuit 408 selects the positive cycles of the DAC AC current The transistor Mrp processes the positive cycle of the current and generates half-wave rectified current pulses that travel to the source of transistor M1 of the configurable transimpedance input loop 410. The negative cycles of the DAC AC current are routed to the 1.2V supply via transistor Mrn.

The configurable transimpedance input loop 410 operates to save extra current at low power. The tail current source is turned off by switching off transistor Mp and the gate of transistor M1 is connected to a 2.1V supply, effectively switching the input loop of the current-mirror to a diode-connected transistor around transistor M2.

The current pulses pass through transistor M2 and are amplified by the gain of the BB filter ($2*G_{bbf}$), which is doubled in this exemplary embodiment to compensate for the loss of the negative pulsed currents. The signal current per channel flows through the output transistor M3 of the transconductance cell 412.

Fourier series analysis of the half-wave rectified current pulses shows that this periodic half-wave rectified signal flowing through the output transistor M3 per channel can be decomposed into a DC signal having a value of ($2*G_{bbf}*I_m/\pi$), and a fundamental having a value of ($G_{bbf}*I_m$). Since there are four channels, the upconverter DC current can be determined from the following expression.

$$I_{upc} = 8*G_{bbf}*I_m/\pi \quad (3)$$

When operating in Class-B mode, the current savings provided by embodiments of the BB filter and upconverter can be calculated from the follow expressions.

$$\frac{I_{upc,class-b}}{I_{upc,class-a}} = \frac{8*G_{bbf}*\left(\frac{I_m}{\pi}\right)}{4*G_{bbf}*(I_{DC}+I_{tail})} \quad (4)$$

$$\frac{I_{upc,class-b}}{I_{upc,class-a}} = \frac{2*I_m}{I_{DC}*(1+0.15)*\pi} \quad (5)$$

$$\frac{I_{upc,class-b}}{I_{upc,class-a}} = 0.55 \quad (6)$$

where $I_{upc,class-b}$ and $I_{upc,class-a}$ are the upconverter's DC 1.2V supply current in Class-A and Class-B operation, respectively. It should be noted that the rectified negative current cycles routed to the 1.2V supply via transistor Mrn increase the 1.2V supply current by ($I_m/\pi$). However, since Gbbf is on the order of 12, equations (4) to (6) are a substantially accurate representation of the current savings. As shown by the above expressions, exemplary embodiments of the baseband filter and upconverter operate to reduce upconverter current consumption by more than 44% as compared to the conventional circuit.

Figure 5:
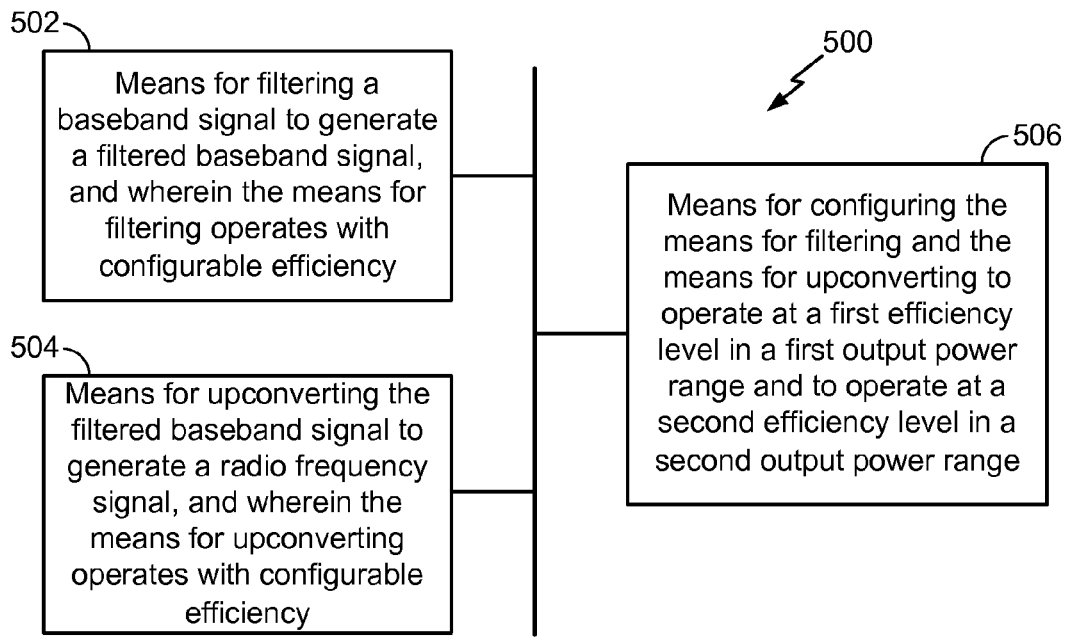
FIG. 5 shows an exemplary embodiment of a configurable baseband filter and upconverter apparatus for use in a wireless device.

FIG. 5 shows an exemplary embodiment of a configurable baseband filter and upconverter apparatus 500 for use in a wireless device. For example, the apparatus 500 is suitable for use as the BB filter 402 and upconverter 404 shown in FIG. 4. In an aspect, the apparatus 500 is implemented by one or more modules configured to provide the functions as described herein. For example, in an aspect, each module comprises hardware and/or hardware executing software.

The apparatus 500 comprises a first module comprising means (502) for filtering a baseband signal to generate a filtered baseband signal, and wherein the means for filtering operates with configurable efficiency, which in an aspect comprises the BB filter 402.

The apparatus 500 also comprises a second module comprising means (504) for upconverting the filtered baseband signal to generate a radio frequency signal, and wherein the means for upconverting operates with configurable efficiency, which in an aspect comprises the upconverter 404.

The apparatus 500 also comprises a third module comprising means (506) for configuring the means for filtering (502) and the means for upconverting (504) to operate at a first efficiency level in a first output power range and to operate at a second efficiency level in a second output power range, which in an aspect comprises the switches 416-420 and 422-425.

Figure 6:
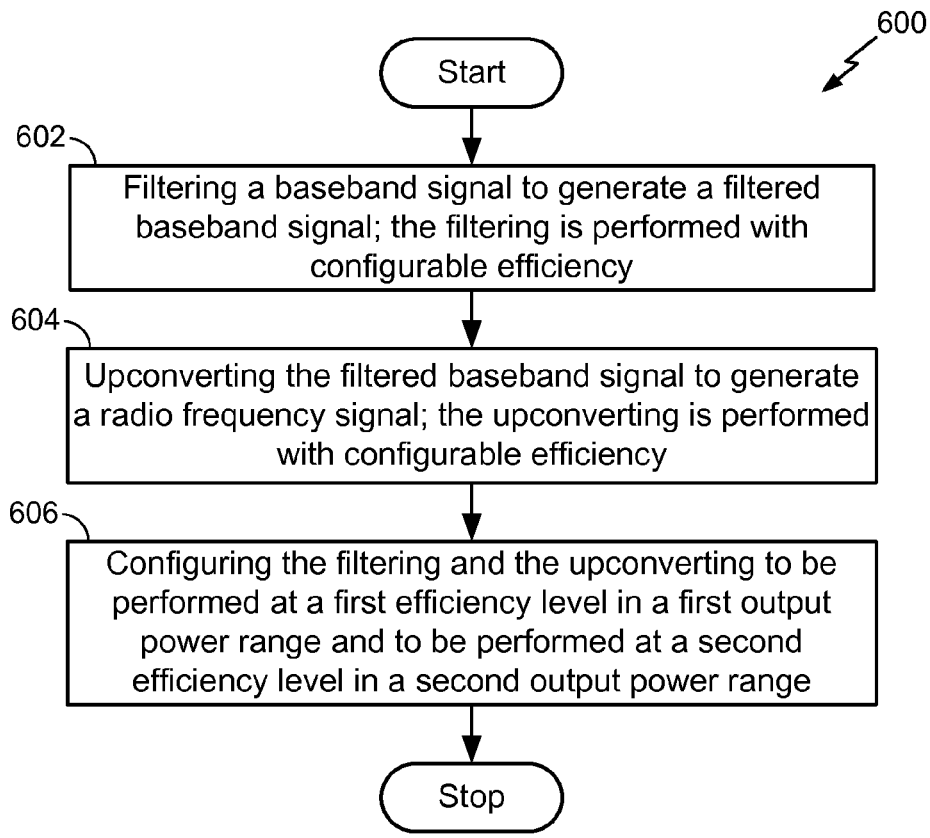
FIG. 6 shows an exemplary embodiment of a method for providing configurable baseband filtering and upconverting in a wireless device

FIG. 6 shows an exemplary embodiment of a method 600 for providing a configurable baseband filtering and upconverting in a wireless device. For example, in an exemplary embodiment, the method 600 is performed by the controller 308 shown in FIG. 3 in conjunction with the BB filter 402 and upconverter 404 shown in FIG. 4.

At block 602, filtering is performed to filter a baseband signal to generate a filtered baseband signal. The filtering is performed with configurable efficiency. In an exemplary embodiment, the filtering is performed by the baseband filter 402 shown in FIG. 4.

At block 604, upconverting is performed to upconvert the filtered baseband signal to generate a radio frequency signal. The upconverting is performed with configurable efficiency. In an exemplary embodiment, the upconverting is performed by the upconverter 404 shown in FIG. 4.

At block 506, configuring is performed to configure the filtering and the upconverting to be performed at a first efficiency level in a first output power range and to be performed at a second efficiency level in a second output power range. For example, in an exemplary embodiment, the first output power range is higher than the second output power range and the second efficiency level is higher than the first efficiency level. In an exemplary embodiment, the configuring is performed by the controller 308 shown in FIG. 3.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
a baseband filter having configurable efficiency;
an upconverter having configurable efficiency and coupled to the baseband filter, and wherein the baseband filter and upconverter are configured to operate at a first efficiency level in a first output power range and to operate at a second efficiency level in a second output power range.

2. The apparatus of claim 1, the second efficiency level is greater than the first efficiency level.

3. The apparatus of claim 1, further comprising a controller operable to configured the baseband filter and the upconverter to operate at the first or second efficiency level based on a selected output power level.

4. The apparatus of claim 1, the first efficiency level is provided by a Class A operating mode and the second efficiency level is provided by one of a Class A/B, Class B, and Class C operating mode.

5. The apparatus of claim 3, the baseband filter comprising a DC bleed circuit configured to reduce a DC level of a digital to analog converter (DAC) output, and wherein the DC bleed circuit is configurable for operation at the first or second efficiency level based on the selected output power level.

6. The apparatus of claim 5, the DC bleed circuit comprising a transistor having a drain terminal connected to the DAC output, a source terminal connected to a system ground, and a gate terminal selectively connected to one of the system ground and a bias voltage.

7. The apparatus of claim 5, the baseband filter comprising a rectifier circuit configured to receive the DAC output and produce a rectified output, and wherein the rectifier circuit is configurable for operation at the first or second efficiency level based on the selected output power level.

8. The apparatus of claim 7, the rectifier circuit comprising first and second transistors having connected source terminals that are selectively connected to the DC bleed circuit.

9. The apparatus of claim 7, further comprising a transimpedance loop configured to receive the rectified output and remove a tail current to generate an adjusted rectified output, and wherein the transimpedance circuit is configurable for operation at the first or second efficiency level based on the selected output power level.

10. The apparatus of claim 9, the transimpedance loop comprising first, second, and third transistors coupled to the rectifier circuit.

11. The apparatus of claim 9, further comprising a transconductance cell configured to amplify the adjusted rectified output from the transimpedance loop, and wherein the transconductance cell is configurable for operation at the first or second efficiency level based on the selected output power level.

12. The apparatus of claim 11, the transconductance cell comprising at least one transistor coupled to the transimpedance loop.

13. The apparatus of claim 1, the first output power range is higher than the second output power range.

14. An apparatus comprising:
means for filtering a baseband signal to generated a filtered baseband signal, and wherein the means for filtering having configurable efficiency;
means for upconverting the filtered baseband signal to generate a radio frequency signal, and wherein the means for upconverting having configurable efficiency; and
means for configuring the means for filtering and the means for upconverting to operate at a first efficiency level in a first output power range and to operate at a second efficiency level in a second output power range.

15. The apparatus of claim 14, the second efficiency level is greater than the first efficiency level.

16. The apparatus of claim 14, the first efficiency level is provided by a Class A operating mode and the second efficiency level is provided by one of a Class A/B, Class B, and Class C operating mode.

17. The apparatus of claim 14, the first output power range is higher than the second output power range.

18. A method, comprising:
filtering a baseband signal to generate a filtered baseband signal, and wherein the filtering is performed with configurable efficiency;
upconverting the filtered baseband signal to generate a radio frequency signal, and wherein the upconverting is performed with configurable efficiency; and
configuring the filtering and the upconverting to be performed at a first efficiency level in a first output power range and to be performed at a second efficiency level in a second output power range.

19. The method of claim 18, the configuring comprising configuring the filtering and the upconverting wherein the first efficiency level is provided by Class A operation and the second efficiency level is provided by one of Class A/B, Class B, and Class C operation.

20. The method of claim 18, the configuring comprising configuring the filtering and upconverting wherein the first output power range is higher than the second output power range.

* * * * *